United States Patent
Joshi et al.

(10) Patent No.: US 6,171,934 B1
(45) Date of Patent: Jan. 9, 2001

(54) RECOVERY OF ELECTRONIC PROPERTIES IN PROCESS-DAMAGED FERROELECTRICS BY VOLTAGE-CYCLING

(75) Inventors: Vikram Joshi; Narayan Solayappan, both of Colorado Springs, CO (US); Walter Hartner; Günther Schindler, both of Munich (DE)

(73) Assignees: Symetrix Corporation, Colorado Springs, CO (US); Siemens Aktiengesellschaft, Munich (DE)

(*) Notice: Under 35 U.S.C. 154(b), the term of this patent shall be extended for 0 days.

(21) Appl. No.: 09/144,297

(22) Filed: Aug. 31, 1998

(51) Int. Cl.[7] .................. H01L 21/326; H01L 21/479; H01L 21/00; H01L 21/8242
(52) U.S. Cl. .................. 438/469; 438/3; 438/240
(58) Field of Search .................. 438/396, 3, 469, 438/240; 427/130

(56) References Cited

U.S. PATENT DOCUMENTS

| | | |
|---|---|---|
| 5,046,043 | 9/1991 | Miller et al. . |
| 5,337,279 * | 8/1994 | Gregory et al. ............... 365/201 |
| 5,372,859 * | 12/1994 | Thakoor ....................... 427/551 |
| 5,434,102 | 7/1995 | Watanabe et al. . |
| 5,487,032 | 1/1996 | Mihara et al. . |
| 5,508,954 | 4/1996 | Mihara et al. . |
| 5,519,234 | 5/1996 | Paz de Araujo et al. . |
| 5,523,964 | 6/1996 | McMillan et al. . |
| 5,525,528 | 6/1996 | Perino et al. . |
| 5,561,307 | 10/1996 | Mihara et al. . |
| 5,977,577 * | 11/1999 | Evans, Jr. ..................... 257/295 |
| 5,990,507 * | 11/1999 | Mochizuki et al. .............. 257/295 |

FOREIGN PATENT DOCUMENTS 0 669 655 A2   8/1995   (EP) .

WO98/05074   2/1998   (WO) .

OTHER PUBLICATIONS

Al-Shareef et al., "Qualitative model for the fatigue-free behavior of SrBi2Ta209," Appl. Phys. Lett., American Institute of Physics, vol. 68 (No. 5), pp. 6910–692 (Jan. 29, 1996).

Furuya et al., "Compositional dependence of electrical characteristics of SrBi2(Ta1–xNbx)209 thin-film capacitors," Journal of Applied Physics, American Institute of Physics, vol. 84 (No. 12), p. 6788–6794 (Dec. 15, 1998).

* cited by examiner

Primary Examiner—Richard Elms
Assistant Examiner—Adam Pyonin
(74) Attorney, Agent, or Firm—Duft, Graziano & Forest, P.C.

(57) ABSTRACT

An integrated circuit is formed containing a metal-oxide ferroelectric thin film. An voltage-cycling recovery process is conducted to reverse the degradation of ferroelectric properties caused by hydrogen. The voltage-cycling recovery process is conducted by applying from $10^4$ to $10^{11}$ voltage cycles with a voltage amplitude of from 1 to 15 volts. Conducting voltage-cycling at a higher temperature in the range 30–200° C. enhances recovery. Preferably the metal oxide thin film comprises layered superlattice material. Preferably the layered superlattice material comprises strontium bismuth tantalate or strontium bismuth tantalum niobate. If the integrated circuit manufacture includes a forming-gas anneal, then the voltage-cycling recovery process is performed after the forming-gas anneal. The voltage-cycling recovery process obviates oxygen-recovery annealing, and it allows continued use of conventional hydrogen-rich plasma processes and forming-gas anneals without the risk of permanent damage to the ferroelectric thin film.

15 Claims, 8 Drawing Sheets

RECOVERY OF ELECTRONIC PROPERTIES IN PROCESS-DAMAGED FERROELECTRICS BY VOLTAGE-CYCLING

BACKGROUND OF THE INVENTION

1. Field of the Invention

The invention relates to a method for fabricating a ferroelectric integrated circuit that reduces or eliminates the degradation of electronic properties resulting from exposure to hydrogen and other damaging fabrication processes.

2. Statement of the Problem

Ferroelectric compounds possess favorable characteristics for use in nonvolatile integrated circuit memories. See Miller, U.S. Pat. No. 5,046,043. A ferroelectric device, such as a capacitor, is useful as a nonvolatile memory when it possesses desired electronic characteristics, such as high residual polarization, good coercive field, high fatigue resistance, and low leakage current. Lead-containing $ABO_3$-type ferroelectric oxides such as PZT (lead zirconium titanate) and PLZT (lead lanthanum zirconium titanate) have been studied for practical use in integrated circuits. Layered superlattice material oxides have also been studied for use in integrated circuits. See Watanabe, U.S. Pat. No. 5,434,102. Layered superlattice materials exhibit characteristics in ferroelectric memories that are orders of magnitude superior to those of PZT and PLZT compounds. Integrated circuit devices containing ferroelectric elements are currently being manufactured. Nevertheless, the persistent problem of hydrogen degradation during the manufacturing process hinders the economical production in commercial quantities of ferroelectric memories and other IC devices using either the $ABO_3$-type oxides or the layered superlattice material compounds with the desired electronic characteristics.

A typical ferroelectric memory in an integrated circuit contains a semiconductor substrate and a metal-oxide semiconductor field-effect transistor (MOSFET) in electrical contact with a ferroelectric device, usually a ferroelectric capacitor. A ferroelectric capacitor typically contains a ferroelectric thin film located between a first or bottom electrode and a second or top electrode, the electrodes typically containing platinum. During manufacture of the circuit, the MOSFET is subjected to conditions causing defects in the silicon substrate. For example, the CMOS/MOSFET manufacturing process usually includes high energy steps, such as ion-mill etching and plasma etching. Defects also arise during heat treatment for crystallization of the ferroelectric thin film at relatively high temperatures, often in the range 500°–900° C. As a result, numerous defects are generated in the single crystal structure of the semiconductor silicon substrate, leading to deterioration in the electronic characteristics of the MOSFET.

To restore the silicon properties of the MOSFET/CMOS, the manufacturing process typically includes a forming-gas, or hydrogen, annealing ("FGA") step, in which defects such as dangling bonds are eliminated by utilizing the reducing property of hydrogen. Various techniques have been developed to effect the hydrogen annealing, such as $H_2$-gas heat treatment in ambient conditions. Conventionally, hydrogen treatments are conducted between 350° and 550° C., typically around 400–450° C. for a time period of about 30 minutes. In addition, the CMOS/MOSFET manufacturing process requires other fabrication steps that expose the integrated circuit to hydrogen, often at elevated temperatures, such as hydrogen-rich plasma CVD processes for depositing metals and dielectrics, growth of silicon dioxide from silane or TEOS sources, and etching processes using hydrogen and hydrogen plasma. During processes that involve hydrogen, the hydrogen diffuses through the top electrode and the side of the capacitor to the ferroelectric thin film and reduces the oxides contained in the ferroelectric material. The absorbed hydrogen also metallizes the surface of the ferroelectric thin film by reducing metal oxides. As a result of these effects, the electronic properties of the capacitor are degraded. This problem is acute in ferroelectric memories containing layered superlattice material compounds because these oxide compounds are particularly complex and prone to degradation by hydrogen-reduction. After the forming-gas anneal (FGA), the remanent polarization of the ferroelectrics is very low and no longer suitable for storing information. Also, an increase in leakage currents results.

Several methods have been reported in the art to inhibit or reverse hydrogen degradation of desired electronic properties in ferroelectric oxide materials. Oxygen-annealing at high temperature (800° C.) for about one hour results in virtually complete recovery of the ferroelectric properties degraded by hydrogen treatments. But the high-temperature oxygen-anneal itself may generate defects in silicon crystalline structure, and it may offset somewhat the positive effects of any prior forming-gas anneal on the CMOS characteristics. Special metallization layers and diffusion barrier layers have also been examined to minimize the effects of hydrogen during high-energy process steps and forming-gas annealing steps. The metallization schemes typically involve the use of materials that are prone to oxidation in an oxygen-containing environment at temperatures above 400° C. Aluminum, the primary metallization material, has a low melting point and cannot tolerate temperatures above 450° C. Encapsulation of the ferroelectric material with a hydrogen diffusion barrier layer is not completely effective practically, and it requires complex process schemes including depositing and removing the barrier material.

It is, therefore, desirable to find a method for fabricating ferroelectric integrated circuits that eliminates the degradation of electronic properties resulting from hydrogen-containing and other processing steps, but which does not add substantial changes to conventional CMOS processing or introduce complicated process schemes, such as encapsulation of ferroelectric material with hydrogen diffusion barriers.

3. Solution to the Problem

The invention provides a method for fabricating ferroelectric elements in integrated circuits that reverses the detrimental effects of hydrogen degradation and other fabrication-related damage in ferroelectric material oxides, avoids addition of complex and expensive processing schemes, and obviates counterproductive oxygen annealing. By eliminating high-temperature $O_2$-recovery annealing and other complicated processing steps, such as encapsulation of the ferroelectric with diffusion barriers, previously considered essential for minimizing hydrogen degradation, the inventive method allows FeRAM manufacturers to continue using conventional hydrogen-rich plasma processes and forming-gas anneals (for surface-state curing) without the risk of permanent damage to the ferroelectric element.

A primary feature of the invention is performing a voltage-cycling recovery process to reverse the effects of hydrogen degradation, thereby recovering desired electronic and ferroelectric properties of the ferroelectric element. When possible, the voltage-cycling recovery process is performed after hydrogen-plasma processes, forming-gas anneal steps, and other high-energy steps of integrated circuit fabrication that cause oxide-damaging conditions.

An aspect of the invention is that the results of the voltage cycling recovery process are dependant on the voltage level and number of cycles, or frequency. The voltage-cycling recovery process is typically conducted at ambient room temperature. At ambient room temperature, the number of voltage cycles applied is in a range from approximately $10^4$ cycles to $10^{11}$ cycles, and the electrical pulses applied have a voltage amplitude in a range of from 1 volts to 15 volts. The number of cycles and the voltage amplitude can be decreased by performing the voltage cycling recovery process at a higher temperature, for example in a range from 30° to 200° C. Preferably the voltage-cycling recovery process is conducted at a temperature of about 125°–150° C.

If the integrated circuit fabrication process includes a forming-gas anneal, the forming-gas anneal is typically conducted at a temperature range from 300° to 1000° C. for a time duration of from one minute to two hours. Experimental results have shown that if a forming-gas anneal is performed in the temperature range of about from 400° C. to 450° C. for about 30 minutes, then the ferroelectric and electronic properties of the ferroelectric element are practically fully recovered when a voltage-cycling recovery process is conducted with $10^5$–$10^6$ voltage cycles at 10 volts, or with $10^9$ cycles at 5 volts.

Another feature of the invention is that the ferroelectric element comprises metal oxides. The metal-oxide material can be an $ABO_3$-type perovskite compound, such as PZT (lead zirconium titanate) and PLZT (lead lanthanum zirconium titanate). Preferably the metal-oxide is a ferroelectric layered superlattice material, such as strontium bismuth tantalate (SBT) or strontium bismuth tantalum niobate (SBTN).

Numerous other features, objects and advantages of the invention will become apparent from the following description when read in conjunction with the accompanying drawings.

DETAILED DESCRIPTION OF THE PREFERRED EMBODIMENT

1. Overview

Figure 1:
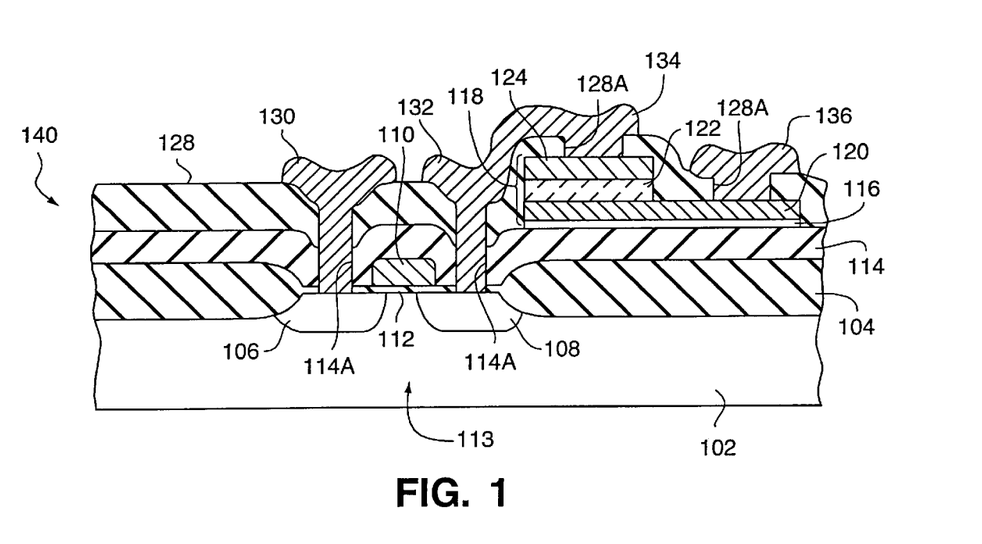
FIG. 1 is a cross-sectional view of a portion of an integrated circuit as may be fabricated by the method of the invention showing a nonvolatile ferroelectric memory cell in which the capacitor is offset laterally from the switch.
Figure 2:
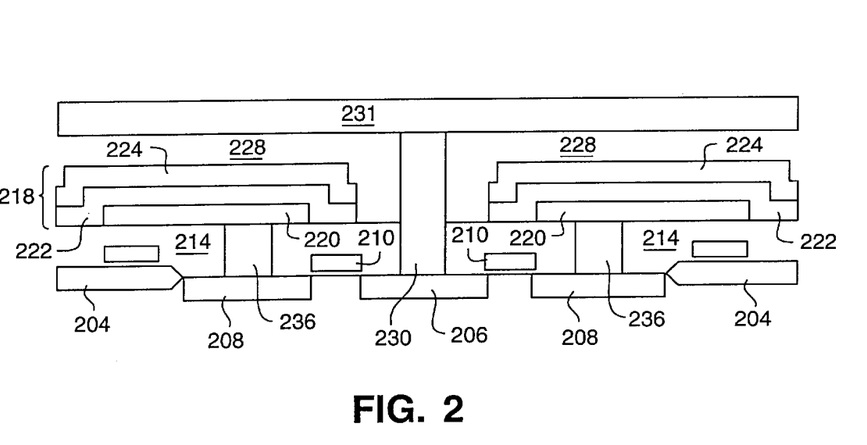
FIG. 2 is a schematic of a cross-sectional view of a portion of an integrated circuit as may be fabricated by the method of the invention showing a stacked nonvolatile ferroelectric memory cell in which the capacitor is located above the switch.
Figure 3:
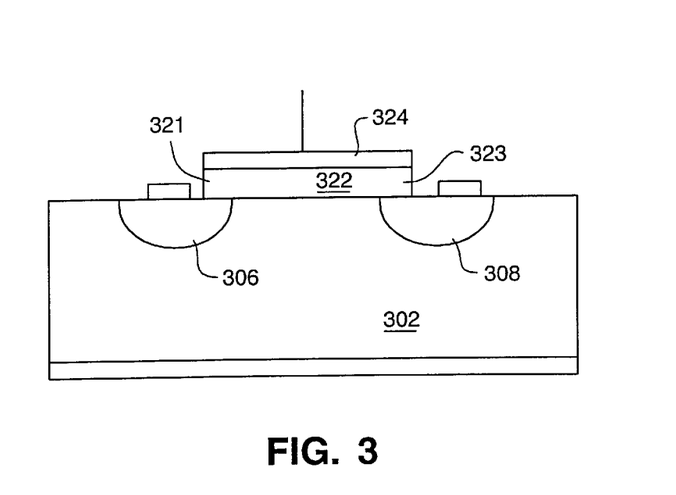
FIG. 3 is a schematic of a cross-sectional view of a portion of an integrated circuit as may be fabricated by the method of the invention showing a ferroelectric transistor.

It should be understood that the FIGS. 1–3, 5 and 6 depicting ferroelectric integrated circuit devices are not meant to be actual plan or cross-sectional views of any particular portion of an actual integrated circuit device. In the actual devices the layers will not be as regular and their thicknesses may have different proportions. The various layers in actual devices often are curved and possess overlapping edges. The figures instead show idealized representations which are employed to depict more clearly and fully the method of the invention than would otherwise be possible. Also, the figures represent only one of innumerable variations of ferroelectric devices that could be fabricated using the method of the invention. FIG. 1 depicts a ferroelectric memory containing a switch in the form of a field effect transistor in electrical connection with a ferroelectric capacitor. FIG. 2 depicts a ferroelectric memory containing a stacked ferroelectric capacitor connected via a plug to the switch element below. But it is also contemplated to use the method of this invention to fabricate a ferroelectric FET memory in which the ferroelectric element is incorporated in the switch element, as depicted in FIG. 3. Such a ferroelectric FET is described in McMillan, U.S. Pat. No. 5,523,964, which is incorporated herein by reference. Likewise, other integrated circuits fabricated using the method of the invention could include other elements and compositions of material.

In FIG. 1, there is shown a cross-sectional view of an exemplary nonvolatile ferroelectric memory cell that could be fabricated according to the method of the invention. The general manufacturing steps for fabricating integrated circuits containing MOSFETs and ferroelectric capacitor elements is described in Yoshimori, U.S. Pat. No. 5,561,307, which is hereby incorporated by reference as if completely contained herein. General fabrication methods have been described in other references also. Therefore, the elements of the circuit of FIG. 1 will be simply identified here.

In FIG. 1, a field oxide region 104 is formed on a surface of a silicon substrate 102. A source region 106 and a drain region 108 are formed separately from each other within silicon substrate 102. A gate insulating layer 112 is formed on the silicon substrate 102 between the source and drain regions 106 and 108. Further, a gate electrode 110 is formed on the gate insulating layer 112. These source region 106, drain region 108, gate insulating layer 112 and gate electrode 110 together form a MOSFET 113.

An interlayer dielectric layer (ILD) 114 made of BPSG (boron-doped phosphosilicate glass) is formed on substrate 102 and field oxide region 104. An adhesive layer 116 is formed on a portion of ILD 114, and then a ferroelectric thin film capacitor 118 is formed on adhesive layer 116. The adhesive layer 116 is made of, for example, titanium, and typically has a thickness of 200 Å.

Ferroelectric capacitor 118 is preferably formed on a conventional wafer 140 that may comprise silicon, gallium arsenide or other semiconductor, or an insulator, such as silicon dioxide, glass or magnesium oxide (MgO). The bottom and top electrodes of ferroelectric capacitors conventionally contain platinum. It is preferable that the bottom electrode contains a non-oxidized precious metal such as platinum, palladium, silver, and gold. In addition to the precious metal, metal such as aluminum, aluminum alloy, aluminum silicon, aluminum nickel, nickel alloy, copper alloy, and aluminum copper may be used for electrodes of a ferroelectric memory. Adhesive layers, such as titanium, enhance the adhesion of the electrodes to adjacent underlying or overlying layers of the circuits.

In FIG. 1, the ferroelectric capacitor 118 comprises a bottom electrode 120 made of platinum and having a thickness of 2000 Å (angstroms), a ferroelectric thin film 122 formed on the bottom electrode 120, and a top electrode 124 formed on the ferroelectric film 122, made of platinum and having a thickness of 2000 Å. The composition and structure of the ferroelectric thin film 122 is discussed in more detail below.

A second interlayer dielectric layer (ILD) 128 made of NSG (nondoped silicate glass) is formed on ILD 114. A PSG (phospho-silicate glass) film or a BPSG film could also be used in ILD 128. Openings 114A are selectively opened through ILD 114 and ILD 128 to expose the source region 106 and gate region 108. Source electrode wiring 130 and drain electrode wiring 132 are formed to fill openings 114A. Other openings 128A are selectively opened through ILD 128 to expose top electrode 124 and bottom electrode 120. Top electrode wiring 134 and bottom electrode wiring 136 are formed to fill these openings 128a. The drain electrode wiring 132 is electrically connected to top electrode wiring 134. Each of these wirings 130, 132, 134 and 136 is made of Al—Si with a thickness of about 3000 Å.

The voltage-cycling recovery process of the invention is typically performed after completion of the wiring-deposition and other process steps, particularly FGA, that create reducing conditions in the integrated circuit.

In FIG. 2, there is shown a cross-sectional view of an alternative embodiment of an exemplary nonvolatile ferroelectric memory cell that could be fabricated according to the method of the invention. The memory of FIG. 2 is a stacked nonvolatile ferroelectric memory cell in which the capacitor is located above the switch. FIG. 2 depicts field oxide regions 204, source region 206, drain regions 208 and gate region 210. The source region 206 is connected by wiring via 230 to metallized circuit connection layer 231. Drain regions 208 are connected by wiring via 236 to bottom electrodes 220 through ILD 214. Ferroelectric thin films 224 are located on bottom electrodes 220, and top electrodes 224 are on thin films 222. After patterning, layers 220, 222 and 224 form capacitors 218, which are covered by ILD 228.

In FIG. 3, there is shown a cross-sectional view of an exemplary nonvolatile ferroelectric transistor that could be fabricated according to the method of the invention. Source region 306 and drain region 308 are located in silicon semiconductor substrate 302. Ferroelectric thin film 322 is located on substrate 302, a portion 321 of thin film 322 being in contact with source region 306, and a portion 323 of thin film 322 being in contact with drain region 308. top electrode layer 324 is in electrical contact with the rest of the integrated circuit.

The composition of the ferroelectric thin films 122, 222, 322 can be selected from a group of suitable ferroelectric materials, including but not limited to: an $ABO_3$-type perovskite, such as a titanate (e.g., $BaTiO_3$, $SrTiO_3$, $PbTiO_3$ (PT), $(PbLa)(ZrTi)O_3$ (PLZT), $Pb(ZrTi)O_3$ (PZT)) or a niobate (e.g., $KNbO3$), or, preferably, a layered superlattice material.

U.S. Pat. No. 5,519,234 issued May 21, 1996, incorporated herein by reference, discloses that layered superlattice compounds, such as strontium bismuth tantalate (SBT), have excellent properties in ferroelectric applications as compared to the best prior art materials and have high dielectric constants and low leakage currents. U.S. Pat. No. 5,434,102 issued Jul. 18, 1995 and U.S. Pat. No. 5,468,684 issued Nov. 21, 1995, incorporated herein by reference, describe processes for integrating these materials into practical integrated circuits. Ferroelectric layered superlattice materials, like the metal oxides $SrBi_2Ta_2O_9$ (SBT) and $SrBi_2(Ta_{1-x}Nb_x)_2O_9$ (SBTN), where $0 \leq x \leq 1$, are currently under development for use as capacitor dielectric in nonvolatile memory applications (FeRAM).

The word "compound" used precisely refers to a homogeneous substance in which the identical molecules all comprise the same chemical elements and structure. The term "material" may comprise molecules of different composition. For example, the layered superlattice material strontium bismuth tantalum niobate comprises interconnected crystal lattices in which two different kinds of atoms, tantalum and niobium, occupy variously the B-site positions of the otherwise uniform crystal structure. Nevertheless, the terms "layered superlattice material", "layered superlattice compound", and "layered superlattice material compound" are used virtually interchangeably in this specification and their meaning is clear from the context.

The word "substrate" can mean the underlying wafer 102 on which the integrated circuit is formed, as well as any object on which a thin film layer is deposited, such as BPSG layer 114. In this disclosure "substrate" shall mean the object to which the layer of interest is applied; for example, when we are talking about a bottom electrode, such as 120, the substrate includes the layers 116 and 114 on which the electrode 120 is formed.

The term "thin film" is used herein as it is used in the integrated circuit art. Generally it means a film of less than a micron in thickness. The thin films disclosed herein are in all instances less than 0.5 microns in thickness. Preferably, the ferroelectric thin films 122, 222, 322 are 200 Å to 3000 Å thick, and most preferably 1200 Å to 2500 Å thick. These thin films of the integrated circuit art should not be confused with the layered capacitors of the macroscopic capacitor art which are formed by a wholly different process which is incompatible with the integrated circuit art.

The term "stoichiometric" herein may be applied to both a solid film of a material, such as a layered superlattice material, or to the precursor for forming a material. When it is applied to a solid thin film, it refers to a formula which shows the actual relative amounts of each element in a final solid thin film. When applied to a precursor, it indicates the molar proportion of metals in the precursor. A "balanced" stoichiometric formula is one in which there is just enough of each element to form a complete crystal structure of the material with all sites of the crystal lattice occupied, though in actual practice there always will be some defects in the crystal at room temperature. For example, both $SrBi_2(TaNb)O_9$ and $SrBi_2(Ta_{1.44}Nb_{0.56})O_9$ are balanced stoichiometric formulas. In contrast, a precursor for strontium bismuth tantalum niobate in which the molar proportions of strontium, bismuth, tantalum, and niobium are 1, 2.18, 1.44, and 0.56, respectively, is represented herein by the unbalanced "stoichiometric" formula $SrBi_{2.18}(Ta_{1.44}Nb_{0.56})O_9$, since it contains excess bismuth beyond what is needed to form a complete crystalline material. In this disclosure an "excess" amount of a metallic element means an amount greater than required to bond with the other metals present to make the desired material, with all atomic sites occupied and no amount of any metal left over. However, as known in the art, because bismuth oxide is highly volatile and significant heat is used in fabricating electronic devices according to the invention, the molar proportion of bismuth in a solid ferroelectric layer 122, 222, 322, made according to the process of the invention will generally be less than that in the stoichiometric formula for the precursor. However, the molar proportions of strontium, tantalum, and niobium in ferroelectric layer 122, 222, 322, made according to the process of the invention will be very close or identical to the molar proportions given in the stoichiometric formula for the precursor. See U.S. Pat. No. 5,434,102 issued to Watanabe et al.

It is also known in the art that a layered superlattice material made from a precursor with an amount of superlattice generator element or B-site element in excess of the stoichiometrically balanced amount is more resistant to degradation by hydrogen than material made from a precursor containing amounts of metal corresponding to a balanced stoichiometric formula. For example, amounts in the precursor of at least one metal, such as bismuth and niobium, above or in addition to that present in a balanced formula, inhibit hydrogen degradation.

2. Description of Preferred Method

Figure 4:
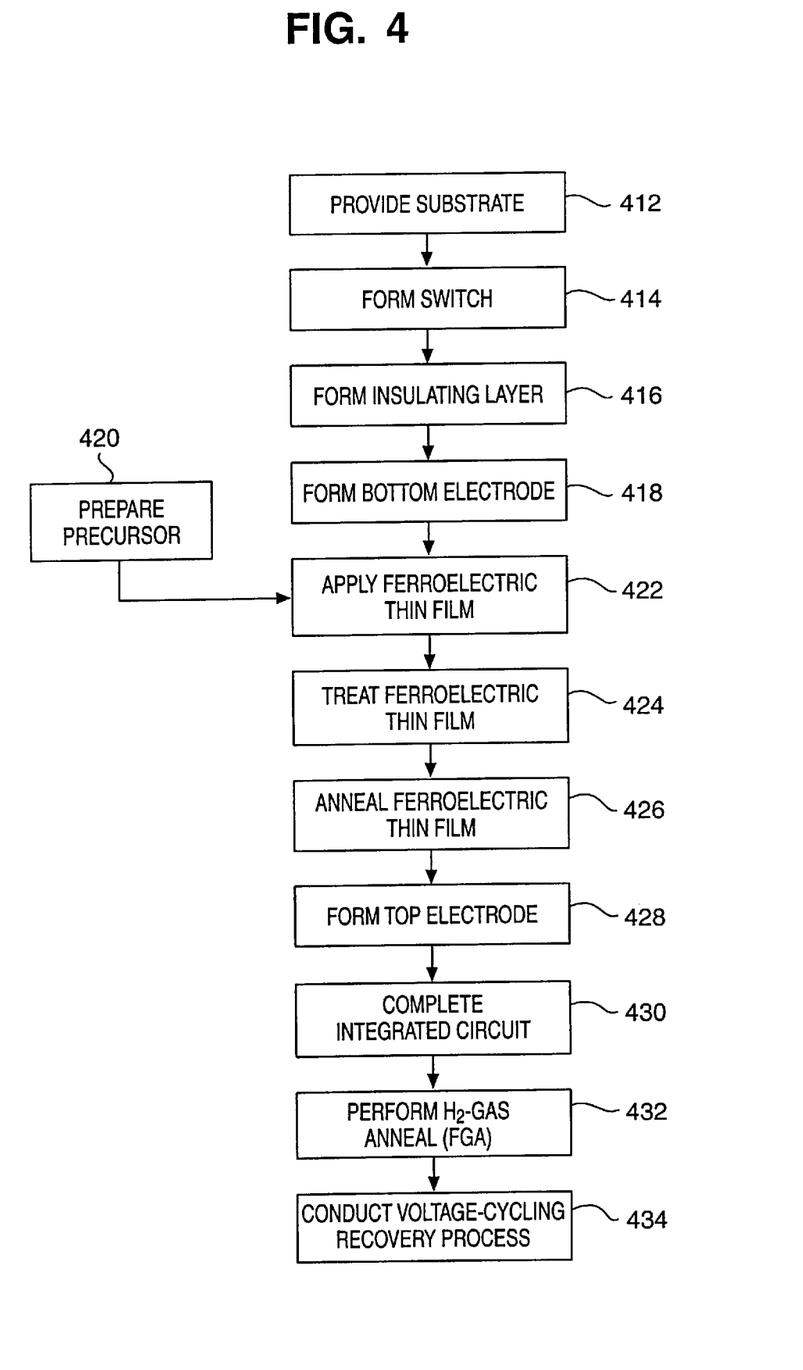
FIG. 4 is a flow chart showing the preferred embodiment of a process for fabricating a nonvolatile ferroelectric memory device according to the invention.

The diagram of FIG. 4 is a flow sheet of the fabrication steps of the process 410 including the method of this invention to make a ferroelectric memory as depicted in FIG. 1. In step 412, a semiconductor substrate is provided on which a switch is formed in step 414. The switch is typically a MOSFET. In step 416, an insulating layer is formed to separate the switching element from the ferroelectric element to be formed. In step 418, a bottom electrode is formed. Preferably, the electrode is made of platinum and is sputter-deposited to form a layer with a thickness of about 2000 Å. In the preferred method, an adhesion layer made of titanium or titanium nitride of about 200 Å would be formed in this step prior to depositing the electrode. The ferroelectric thin film is applied to the bottom electrode in step 422. In the preferred method, the ferroelectric thin film contains layered superlattice material. An MOCVD method is the most preferred method to form the thin film. The ferroelectric thin films also can be applied using a liquid deposition technique, such as a spin-coating or a misted deposition method as described in U.S. Pat. No. 5,456,945. In step 420, chemical precursors of the layered superlattice material that will form the desired ferroelectric thin film are prepared. Usually, precursor solutions are prepared from commercially available solutions containing the chemical precursor compounds. A preferred embodiment utilizes a precursor solution containing relative molar proportions of the elements strontium, bismuth, and tantalum corresponding approximately to the formula $SrBi_2Ta_2O_9$. An alternative preferred embodiment utilizes a precursor solution containing relative molar proportions of the elements strontium, bismuth, tantalum and niobium corresponding approximately to the formula $SrBi_2(Ta_{1-x}Nb_x)_2O_9$, where x is about 0.5. Preferably, the concentrations of the various precursors supplied in the commercial solutions are adjusted in step 420 to accommodate particular manufacturing or operating conditions. For example, the stoichiometric amounts of the various elements in a commercial solution for a layered superlattice thin film might be $SrBi_{2.18}(Ta_{1.44}Nb_{0.56})O_9$. It might be desirable, however, to add excess niobium or bismuth to this solution to generate extra oxides that will protect the ferroelectric compounds from hydrogen-annealing degradation. The application step 422 is preferably followed by a treatment step 424, which preferably includes a drying step in case of liquid deposition, a crystallization substep at elevated temperatures such as a rapid thermal process (RTP), and may include treatment with ultraviolet radiation during or after the application step 422. For example, in a typical spin-on procedure, a coat of the precursor might be applied and dried. Then another precursor coat might be applied and dried. The application and treatment steps 422 and 424 can be repeated several times. The treated film is then annealed in oxygen to form the resulting ferroelectric thin film in step 426. Following steps 422–426, the top electrode is formed in step 428. Step 428 and other steps typically include high-energy material deposition and patterning substeps, such as target sputtering, ion milling or RIE-etching, and ashing. The circuit is generally completed in step 430, which can include a number of substeps; for example, deposition of an ILD, patterning and milling, and deposition of wiring layers.

In step 432, hydrogen annealing of the workpiece is conducted at a temperature and annealing time chosen to satisfactorily eliminate the defects caused in the silicon substrate by oxygen heat treatment and other high-energy processing steps. The hydrogen annealing step is preferably performed with a forming-gas anneal (FGA) using an $H_2$-gas mixture (e.g., 1–5% $H_2$ in $N_2$) under ambient conditions because this is less complex than other alternatives. Preferably, the forming-gas anneal is performed at a temperature in the range 400–450° C. for about 30 minutes.

In step 434, the voltage-cycling recovery process of the invention is conducted to restore the electronic properties of the ferroelectric element that were degraded as a result of hydrogen annealing and other process steps causing hydrogenating or reducing conditions. Voltage-cycling recovery processing effectively reverses the degradation of electronic properties caused by hydrogen reduction in the ferroelectric element. The beneficial effects of the voltage-cycling recovery process generally increase as the voltage increases and as the number of voltage cycles increases. Generally viewed, the inventive voltage-cycling process can be conducted in a range of process conditions. For example, the voltage-cycling recovery can be conducted at a lower voltage, in the range of the normal operating voltage of the integrated circuit device, which is typically from 1 to 5 volts. At a lower voltage in the range 1–5 volts, preferably about $10^9$ voltage cycles are performed. The voltage-cycling recovery process can also be conducted at a higher voltage, for example, in the range 10–15 volts. At a high voltage of 10 volts, a smaller number of cycles, that is, about $10^4$ cycles, effects recovery. Combinations of applied voltage level and number of voltage cycles different from the two examples just described can also be used to effect similar recovery levels. One the one hand, fewer cycles at higher voltage reduce the cycling time of the recovery process, as well as minimize the fatigue in the ferroelectric material. On the other hand, voltage-cycling as high as 10–15 volts might damage integrated circuit devices designed to operate at maximum voltages of 3–5 volts. The applied voltage and the number of cycles can be decreased by conducting the voltage-cycling recovery process at higher temperature, for example, in a range of from 30° C. to 200° C., preferably about 125° C. At higher temperature, the coercive field, Ec, of the ferroelectric material decreases. Thus, the ratio of applied voltage to coercive field, Ec, increases. This has the same effect as doing the cycling at a higher voltage. Preferably, the applied voltage, the number of voltage-cycles, and the process temperature are selected to maximize various criteria, including recovery level, recovery process duration, material cycling-fatigue, and circuit sensitivity to both voltage and temperature. Experimental results show that voltage-cycling recovery in SBT capacitors reached a maximum level at about 125° C., and started decreasing above 200° C.

The voltage-cycling recovery process of the present invention is effective in recovering the electronic characteristics of metal-oxide ferroelectric materials, including $ABO_3$-type perovskites and layered superlattice materials. In particular, experiments have shown that the voltage-cycling recovery process treatment is effective in restoring desired ferroelectric properties in layered superlattice compounds made from a precursor solution with a composition corresponding approximately to the general stoichiometric formula $SrBi_2Ta_2O_9$.

Figure 5:
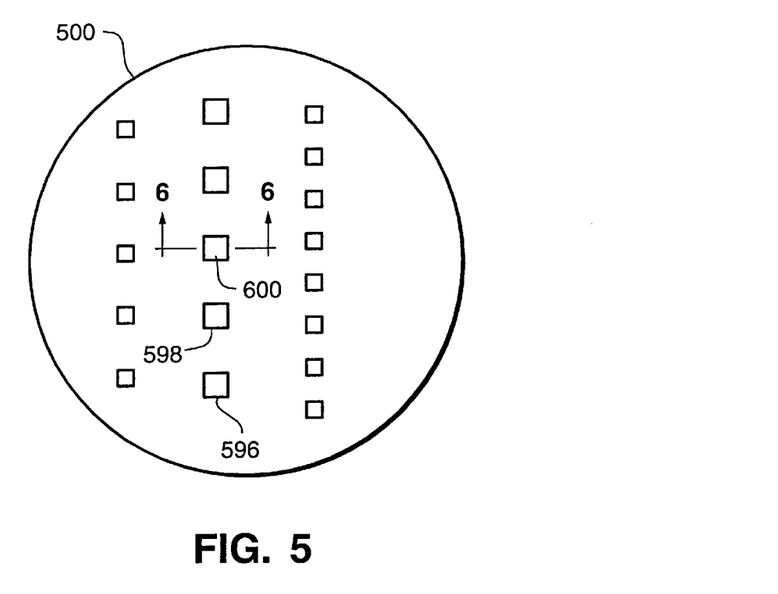
FIG. 5 is a top view of an exemplary wafer on which thin film capacitors fabricated in accordance with the invention are shown greatly enlarged.
Figure 6:
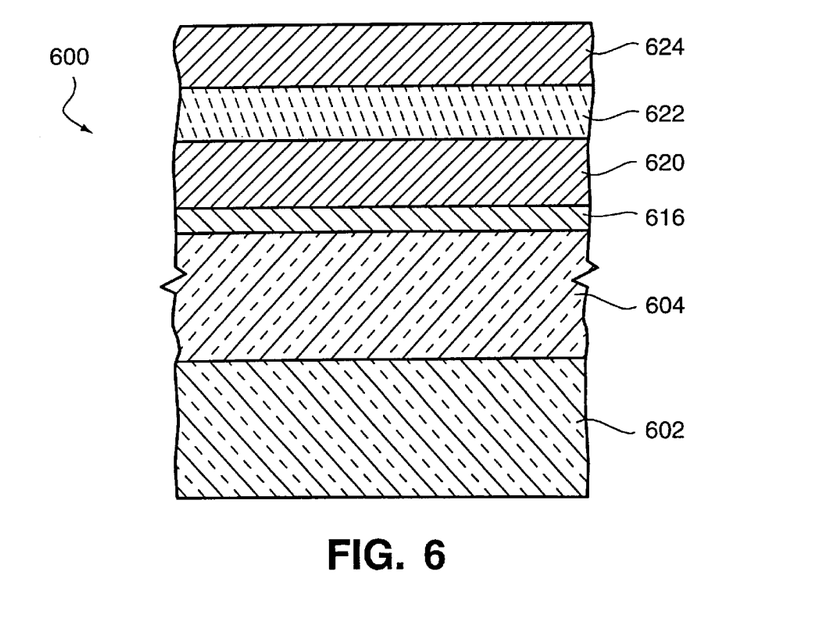
FIG. 6 is a portion of a cross-section of FIG. 5 taken through the lines 6—6, illustrating a thin film capacitor device fabricated in accordance with the invention.

FIG. 5 is a top view of an exemplary wafer on which thin film capacitors 596, 598 and 600 fabricated on substrate 500 in accordance with the invention are shown greatly enlarged. FIG. 6 is a portion of a cross-section of FIG. 5 taken through the lines 6—6, illustrating a thin film capacitor device fabricated in accordance with the invention. A silicon dioxide layer 604 is formed on a silicon crystal substrate 602. A titanium adhesion layer 616 is formed on the silicon dioxide layer 604. Then bottom electrode 620 made of platinum is sputter-deposited on adhesion layer 616. Layer 622 is a ferroelectric thin film, and layer 624 represents the top electrode made of platinum.

EXAMPLE 1

The ferroelectric properties of strontium bismuth tantalate capacitors were studied before a forming-gas anneal (FGA). After a FGA, the effects of applying approximately $10^5$ bipolar electrical cycles at each 1 volt interval between 1 and 10 volts were measured.

The capacitors were fabricated from a strontium bismuth tantalate (SBT) precursor solution commercially available from the Kojundo Chemical Corporation. The solution contained amounts of chemical precursors corresponding to the stoichiometric formula $SrBi_2Ta_2O_9$. The 0.2 mol/l precursor commercial solution contained: bismuth 2-ethylhexanoate, strontium 2-ethylhexanoate, and tantalum 2-ethylhexanoate. Ferroelectric capacitors containing the layered superlattice compound were formed from the precursor solution in general accordance with the method described in Watanabe, U.S. Pat. No. 5,434,102, which is hereby incorporated by reference as if wholly contained herein.

A series of p-type 100 Si wafer substrates 602 were oxidized to form a layer of silicon dioxide 604. A titanium adhesive layer 616 with a thickness in the range of 100–200 Å was sputtered on the substrate, then a bottom platinum electrode 620 of with a thickness in the range of 1000–3000 Å thickness was sputter-deposited on adhesive layer 616. These were annealed 30 minutes in $O_2$ at 650° C., and dehydrated 30 minutes at 180° C. in low vacuum. The 0.2 molar SBT-precursor solution was diluted with n-butyl acetate to 0.12 molar concentration prior to deposition. A spincoat of the 0.12 molar solution of the SBT-precursor was deposited on the bottom electrode 620 at 1800 rpm for 30 seconds. This was dehydrated for one minute at 160° C., increasing to 260° C. for four minutes. The sequence of the spincoat and dehydration steps was repeated. The coating was crystallized using rapid-thermal-annealing (RTA 725° C. 30 sec, 100° C./sec). These steps formed a ferroelectric thin film 622 having a thickness of 170 nm (1700 Å). The wafer and deposited layers were given a first anneal for 60 minutes at 800° C. in $O_2$-gas or $N_2$-gas. Platinum was sputter-deposited to make a top electrode layer 624 with a thickness in the range of 1000–2000 Å thickness. The platinum and strontium bismuth tantalate layers were milled to form the capacitors, and then ashing was performed, followed by a second anneal for 30 minutes at 800° C. in $O_2$-gas or $N_2$-gas. The capacitors had a surface area of 7854 $\mu m^2$.

No forming-gas anneal (FGA) was performed on a first capacitor. An FGA was performed on a second capacitor in a $H_2$—$N_2$ ($H_2$ 5%) gas mixture under ambient conditions, at 430° C. for 30 minutes. Then, a series of voltage-cycling steps together with simultaneous measurements of the electronic properties of the two capacitors were conducted.

On each of two "sweeps" of voltage-cycling and simultaneous measurements, approximately $10^5$ bipolar electrical pulses at 10 kHz were applied at each 1 volt interval from 1 to 10 volts in the first capacitor, "without FGA", and in the second capacitor, "after FGA". The applied bipolar voltage followed a triangular voltage curve. The maximum voltage amplitude was increased in 1 volt intervals from 1 to 10 volts. Exemplary results are shown in FIGS. 7 and 8.

Figure 7:
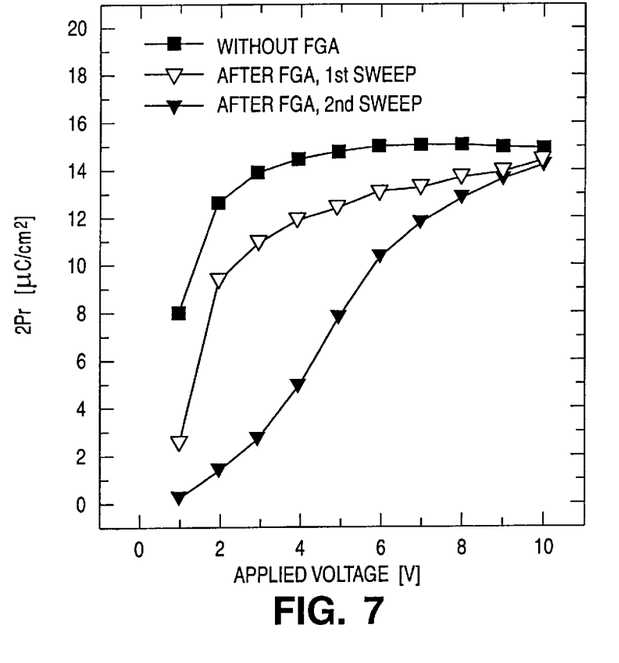
FIG. 7 is a graph of remanent polarization, 2Pr, in units of $\mu C/cm^2$, in strontium bismuth tantalate capacitors as a function of applied voltage from 1 to 10 volts, without forming-gas anneal, after forming-gas anneal at 430° C. for 30 minutes, and after voltage-cycling at 10 kHz applying $10^5$ voltage cycles at each 1 volt interval from 1 to 10 volts.

FIG. 7 is a graph of remanent polarization, 2Pr, in units of $\mu C/cm^2$, in the exemplary strontium bismuth tantalate test capacitors, one "without FGA", the other "after FGA", plotted as a function of applied voltage, where 2Pr measurements were made: in a "1st sweep", whereby about $10^5$ cycles were applied at each 1 volt interval from 1 to 10 volts; and thereafter in a "2nd sweep", whereby about $10^5$ cycles were applied at each 1 volt interval from 1 to 10 volts. Additional cycling and measurements did not result in values different from the 2nd-sweep curves. The process of measuring 2Pr-values in the 1st sweep included applying $10^5$ at each voltage interval; thus, a voltage-cycling process was effectively performed at each voltage value in the very process of measuring 2Pr-values. Similarly, the process of measuring 2Pr-values in the 2nd sweep included applying $10^5$ at each voltage interval; thus, a voltage-cycling process was effectively performed at each voltage value in the process of measuring the second-sweep 2Pr-values. The measured 2Pr-values plotted as solid squares on the "without FGA" curve in FIG. 7 were the same during the 1st-sweep and 2nd-sweep measurments. The measured 2Pr-values plotted as solid triangles at low voltage on the "after FGA, 1st sweep" curve in FIG. 7 show that the polarizability degraded substantially as a result of the FGA; but, the values on the 1st-sweep curve also showed increasing recovery with increasing voltage. The 2Pr-values plotted as empty triangles on the "after FGA, 2nd-sweep" curve follow the values on the "without FGA" curve, even at lower voltages. Thus, the data plotted on the 1st sweep curve and on the 2nd-sweep curve together suggest that the cycling at higher voltages around 10 volts and 10 kHz results in recovering most of the ferroelectric polarizability after $10^5$–$10^6$ cycles.

Figure 8:
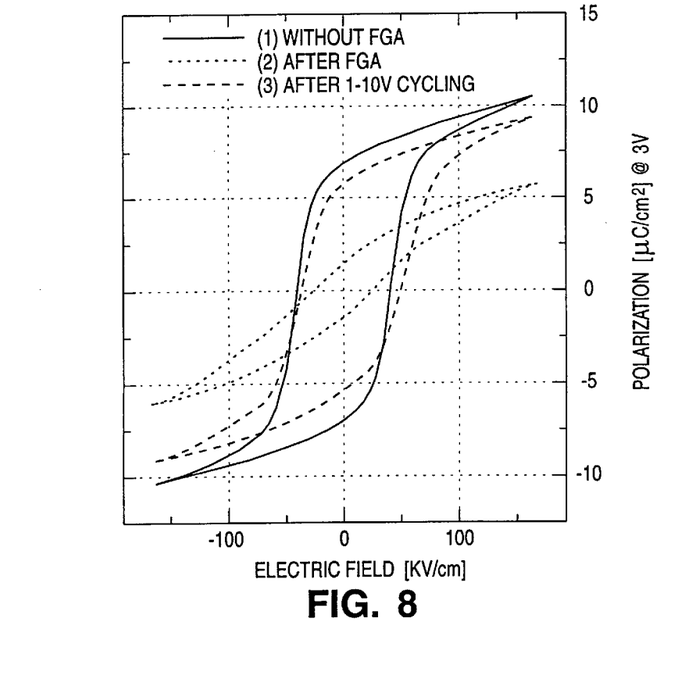
FIG. 8 is a graph of hysteresis curves measured at 3 volts, in which polarization, $\mu C/cm^2$, is plotted as a function of electric field, kV/cm, for strontium bismuth tantalate thin-film capacitors, without forming-gas anneal, and after forming-gas anneal at 430° C. for 30 minutes, and then after voltage-cycling at 10 kHz applying $10^5$ voltage cycles at each 1 volt interval from 1 volt through 10 volts.

FIG. 8 is a graph of hysteresis curves measured at three volts, in which polarization, $\mu C/cm^2$, is plotted as a function of electric field, kV/cm, in the exemplary capacitors of FIG. 7: solid curve "(1) without FGA"; dotted curve "(2) after FGA", measured during the 1st sweep after the FGA at 430° C. for 30 minutes; and dashed curve "(3) after 1–10V", measured after the 1st sweep of $10^5$ cycles were applied at each 1 volt interval from 1 to 10 volts. That is, the hysteresis curves of FIG. 8 correspond to the three measurements on the graph of FIG. 7 plotted at 3 volts. The initial hysteresis curve (solid curve "(1) without FGA"), has the boxy shape associated with good ferroelectric characteristics and a 2Pr-value of about 14 $\mu C/cm^2$. Dotted curve "(2)" is substantially flat and horizontal, indicating poor ferroelectric characteristics and a 2Pr-value of only about 3 $\mu C/cm^2$. In contrast, dashed curve "(3)", measured after the voltage-cycling of the 1st sweep from 1 through 10 volts, has the boxy, vertical shape of curve (1), indicating good ferroelectric characteristics. FIG. 8, therefore, suggests that ferroelectric properties of layered superlattice material was almost completely recovered by a voltage-cycling recovery process at 10 volts with $10^5$–$10^6$ voltage cycles.

EXAMPLE 2

Low-voltage cycling at 5 volts was conducted on test capacitors. Strontium bismuth tantalate capacitors were fabricated as in Example 1. The 2Pr-value was measured in a first SBT capacitor, without FGA, before voltage-cycling. Then, voltage-cycling was performed by applying bipolar triangular electrical pulses at 1 MHz and 5 volts amplitude. Measurements of 2Pr were made after increasing numbers of cycles between about $10^6$ and $10^{11}$ cycles. An FGA was performed on a second SBT capacitor. As in the first capacitor, the 2Pr-value was measured before voltage-cycling. Then, voltage-cycling was conducted by applying bipolar triangular electrical pulses at 1 MHz and 5 volts amplitude. Measurements of 2Pr were made after increasing numbers of cycles between about $10^6$ and $10^{11}$ cycles. Experimental results are plotted on the graphs of FIGS. 9 and 10.

Figure 9:
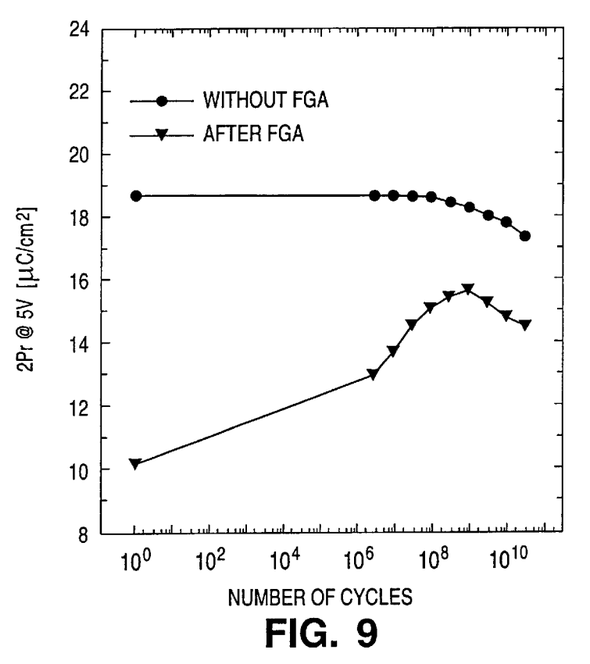
FIG. 9 is a graph of remanent polarization, 2Pr, in units of $\mu C/cm^2$, in strontium bismuth tantalate capacitors, as a function of the number of voltage cycles at 5 volts and 1 MHz, without forming-gas anneal, and after forming-gas anneal at 430° C. for 30 minutes.

FIG. 9 is a graph of remanent polarization, 2Pr, in units of $\mu C/cm^2$, measured at 5 volts, plotted as a function of the number of voltage cycles at 5 volts and 1 MHz, in the first SBT capacitor without forming-gas anneal, and in the second SBT capacitor, after forming-gas anneal at 430° C. for 30 minutes. The 2Pr-value of the capacitor without FGA was about 18.5 $\mu C/cm^2$ before cycling, and it slowly decreased after about $10^8$–$10^9$ voltage cycles. The 2Pr-value measured in the other capacitor after FGA was only about 10 $\mu C/cm^2$ before cycling; it increased to 13 $\mu C/cm^2$ after $10^6$ cycles, and reached a maximum of about 15.7 $\mu C/cm^2$ after about $10^9$ voltage cycles. After $10^9$ cycles the 2Pr-value in the FGA-treated capacitor started to decrease. A 2Pr-value of 12 $\mu C/cm^2$ in a ferroelectric memory material is considered acceptable in the art. Comparison of the two curves in FIG. 9 indicates that the polarizability, measured as 2Pr, of the ferroelectric SBT material substantially recovers to an acceptable level after $10^6$ cycles, and continues to increase with additional voltage-cycling until it reaches maximum recovery at about $10^9$ cycles, after which the polarizability begins to decline.

Figure 10:
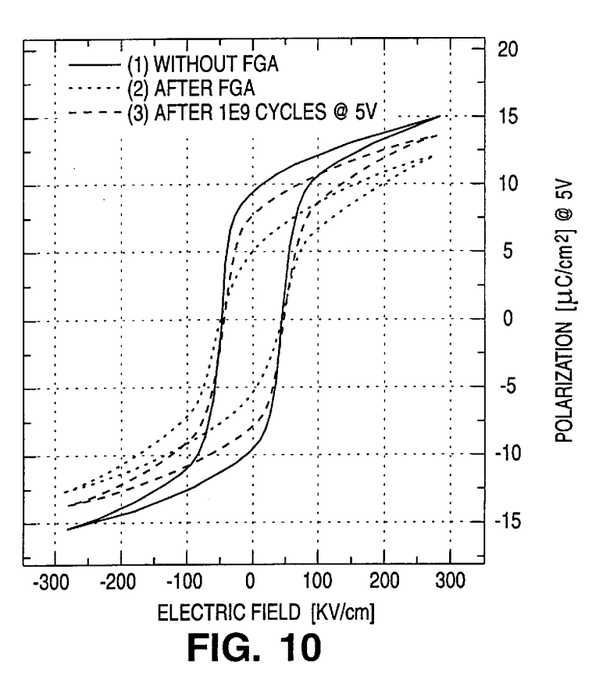
FIG. 10 is a graph of hysteresis curves, in which polarization, $\mu C/cm^2$, is plotted as a function of electric field, kV/cm, measured at 5 volts in strontium bismuth tantalate thin-film capacitors, without forming-gas anneal, and after forming-gas anneal at 430° C. for 30 minutes, and then after a voltage-cycling recovery process at 5 volts for $10^9$ cycles, in accordance with the invention.

FIG. 10 is a graph of hysteresis curves measured at 5 volts, in which polarization, $\mu C/cm^2$, is plotted as a function of electric field, kV/cm, for a SBT thin-film film capacitor without forming-gas anneal, and immediately after forming-gas anneal at 430° C. for 30 minutes, and then after a voltage-cycling recovery process in accordance with the invention at 5 volts for $10^9$ cycles. The dotted curve (2), after FGA but before voltage-cycling, is much narrower and flatter than the solid curve (1), without FGA, indicating that the FGA caused considerable decrease of ferroelectric properties, corresponding to a generally unacceptable 2Pr-value of about 10 $\mu C/cm^2$. Dashed hysteresis curve (3), after voltage-cycling, more closely follows the vertical, boxy shape of curve (1), and shows a 2Pr-value of about 16 $\mu C/cm^2$. The data shown in FIG. 9 and FIG. 10 indicate that a voltage-cycling recovery process at low maximum voltage amplitude successfully recovers ferroelectric properties in ferroelectric metal oxide material.

EXAMPLE 3

The temperature dependance of voltage-cycling was studied in SBT test capacitors. Strontium bismuth tantalate capacitors were fabricated as in Example 1. In a first set of capacitors, without FGA, voltage-cycling was conducted at a series of temperatures in the range 25°–300° C. One new capacitor without FGA was tested at each temperature. In a second set of capacitors, after FGA, voltage-cycling was conducted in the same temperature range. Three sweeps of voltage-cycling and measurements were conducted after FGA on a new individual capacitor at each temperature. The voltage-cycling was performed on all capacitors by applying approximately $10^5$ bipolar triangular voltage at each 1-volt interval from 1 to 10 volts maximum amplitude, at 10 kHz. The 2Pr-value and 2Ec-value were measured in each test capacitor after voltage-cycling at 5 volts on each of the three sweeps. Experimental results are plotted on the graphs of FIGS. 11 and 12.

Figure 11:
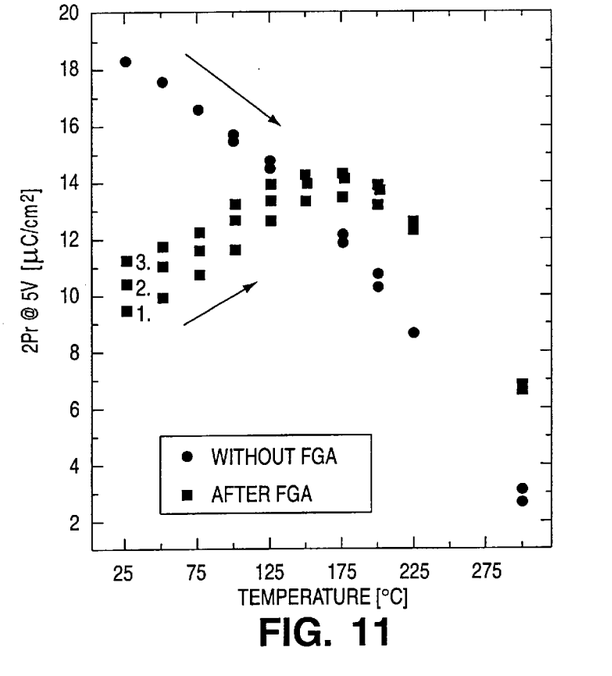
FIG. 11 is a graph of remanent polarization, 2Pr, in units of $\mu C/cm^2$, measured at 5 volts, in SBT capacitors, without FGA and after FGA, plotted as a function of cycling temperature.
Figure 12:
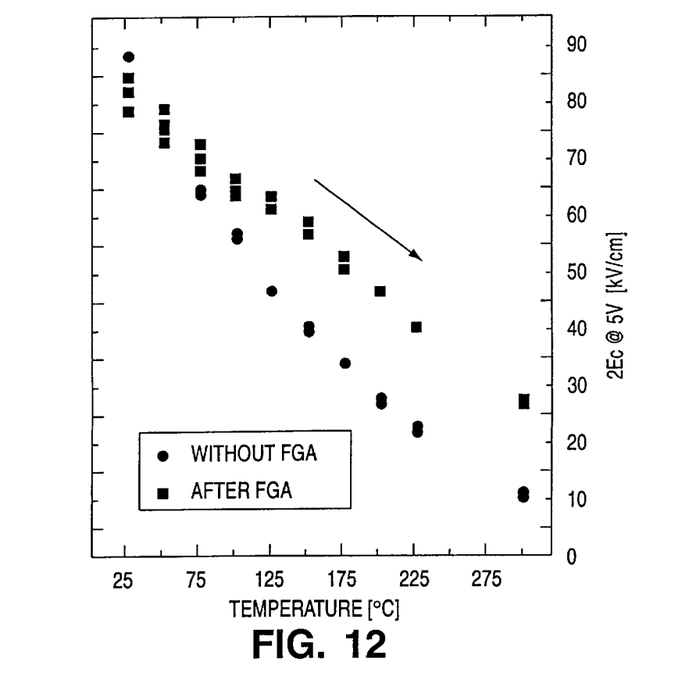
FIG. 12 is graph of coercive field, 2Ec, of test capacitors, in units kV/cm, measured at 5V, plotted as a function of temperature.

FIG. 11 is a graph of remanent polarization, 2Pr, in units of $\mu C/cm^2$, measured at 5 volts, plotted as a function of cycling temperature. The solid circles plotted on the graph, representing test capacitors without FGA, show that 2Pr decreased as a result of voltage-cycling as the cycling-temperature increased above 25° C. The black squares at each temperature in FIG. 11 represent the 2Pr-value of test capacitor subjected to voltage-cycling on three successive sweeps after an FGA. The pattern of squares shows that the degree of recovery of polarizability increased as the temperature of the voltage-cycling process increased above room temperature, reaching a maximum recovery temperature at about 125°–150° C., under the conditions of the experiment. The degree of recovery, however, began to decrease at temperatures above 175° C. FIG. 12 is graph of coercive field, 2Ec, of the test capacitors, in units kV/cm, measured at 5V, plotted as a function of temperature. Normally, the 2Ec-value of a ferroelectric capacitor should not be less than about 60 kV/cm. The pattern of black squares in FIG. 12 shows that the minimum level of 2Ec in the test capacitors was maintained up to a temperature of about 125°–150° C., which temperature is also in the range at which the 2Pr-value reached a maximum.

EXAMPLE 4

Figure 13:
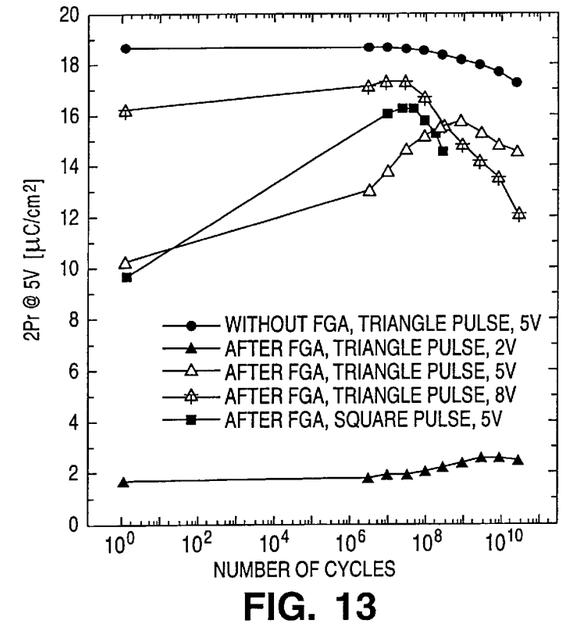
FIG. 13 is a graph of 2Pr-value, in units of $\mu C/cm^2$, plotted as a function of number of voltage cycles, in SBT capacitors, without FGA and after FGA, under different conditions of maximum voltage amplitude and pulse shape.
Figure 14:
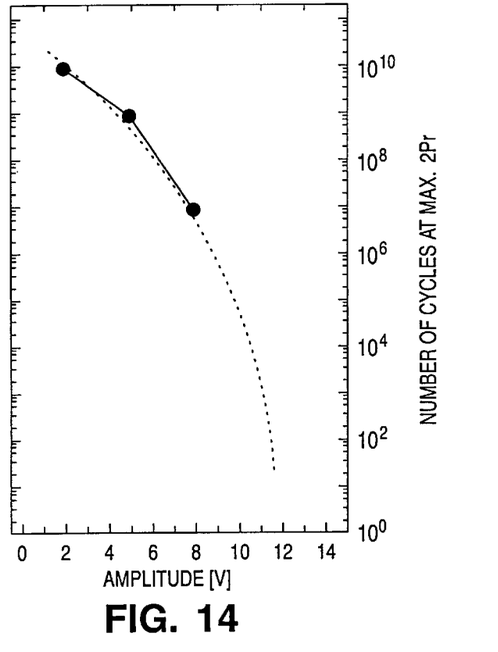
FIG. 14 is a graph of the number of cycles at maximum 2Pr-value of SBT capacitors with FGA plotted as a function of maximum voltage-cycling voltage amplitude.

The fatigue characteristics in SBT capacitors with FGA and without FGA were measured after application of bipolar pulses at increasing numbers of cycles. Strontium bismuth tantalate capacitors were fabricated as in Example 1. The polarizability in a first capacitor without FGA (represented by solid circles in FIG. 13) was measured successively at 5 volts after application of increasing numbers of cycles of bipolar triangular voltage pulses at 5 volts maximum amplitude. Similarly, the 2Pr-value at 5 volts was measured in three other test capacitors with FGA after successive total numbers of bipolar triangular voltage pulses conducted at maximum voltage amplitude of 2 volts (solid triangles in FIG. 13), 5 volts (empty triangles in FIG. 13), and 8 volts (hatched triangles in FIG. 13), respectively. Finally, the 2Pr-value at 5 volts was measured in a test capacitor with FGA after successive total numbers of bipolar square voltage pulses conducted at a maximum voltage amplitude of 5 volts (solid squares in FIG. 13). The 2Pr-value of the capacitor without FGA was about 18.5 $\mu C/cm^2$ before cycling, and it slowly began to decrease after about $10^8$–$10^9$ triangular voltage cycles. The 2Pr-value in the capacitor subjected to voltage-cycling at 2 volts maximum amplitude was less than 2 $\mu C/cm^2$ at the first measurement during application of $10^5$ cycles, and it never exceeded three, even after $10^9$ cycles. Application of triangular pulses at 8 volts resulted in recovery of the 2Pr-value to about 16 $\mu C/cm^2$, after only about $10^5$ cycles. Voltage-cycling with triangular pulses at 5 volts resulted in less maximum recovery (to about 15 $\mu C/cm^2$) than cycling at 8 volts, but the decline in 2Pr-value after $10^9$ cycles was more gradual. When the voltage-cycling was conducted at 5 volts maximum amplitude with square wave pulses, the rate of recovery was faster than with triangular pulses; however, recovery declined more rapidly after $10^8$ cycles. The results of fatigue at different values of maximum amplitude of cycling voltage are depicted in the graph of FIG. 14, in which the number of cycles at maximum 2Pr-value is plotted as a function of maximum voltage amplitude in SBT capacitors with FGA. After application of triangular cycles at 1 MHz and 8 volts, the maximum 2Pr-value was maintained only up to about $10^8$ cycles; when the maximum voltage amplitude was 5 volts, the maximum 2Pr was maintained up to $10^8$ cycles. With a maximum voltage amplitude of 2 volts, maximum 2Pr was maintained up to $10^{10}$ cycles, albeit at very low 2Pr-value.

The results of Examples 1–4 show that a voltage-cycling recovery process effectively recovers the ferroelectric properties of a ferroelectric metal-oxide thin film, while minimizing the damage to surface states of silicon substrates and CMOS/MOSFET elements. The maximum voltage amplitude of the voltage-cycling recovery process of the invention can be varied between low voltage (1–5 volts) and high voltage (10–15 volts). The frequency and total number of voltage cycles can be varied, depending on voltage amplitude, temperature, and required degree of recovery. The higher the voltage or temperature, the fewer cycles are needed to achieve a given recovery. Any number of cycles greater than $10^3$ may be effective. Preferably between $10^4$ and $10^9$ voltage cycles are applied. Generally viewed, the inventive voltage-cycling recovery process can be conducted in a range of process conditions. Thus, a combination of voltage amplitude, number of cycles, pulse form, and frequency can be selected for a given process temperature to accommodate integrated circuit fabrication requirements.

The method of the invention may be used alone or in combination with other methods, devices and compositions intended to inhibit or reverse the detrimental effects of hydrogen degradation. Even though the invention is intended to obviate the need for such other measures, it can nevertheless be used with them; for example, with hydrogen barrier layers. The method of the invention is useful to reverse hydrogen degradation regardless of how it is caused. Reducing and other damaging conditions can arise in many circumstances during integrated circuit fabrication; even routine handling of the wafer can result in degradation of electronic properties. Thus, the voltage-cycling recovery process is useful even if an integrated circuit has not been subjected to a forming-gas anneal.

There has been described a method for fabricating ferroelectric integrated circuits that permits exposure to hydrogen and still results in ferroelectric devices with good electrical properties. It should be understood that the particular embodiments shown in the drawings and described within this specification are for purposes of example and should not be construed to limit the invention which will be described in the claims below. Further, it is evident that those skilled in the art may now make numerous uses and modifications of the specific embodiments described, without departing from the inventive concepts. For example, now that a voltage-cycling recovery process of the integrated circuit has been identified as an important part of the process for fabricating ferroelectric memory devices, this method can be combined with other processes to provide variations on the method described. It is also evident that the steps recited may in some instances be performed in a different order; or equivalent structures and process may be substituted for the various structures and processes described. Consequently, the invention is to be construed as embracing each and every novel feature and novel combination of features present in and/or possessed by the fabrication processes, electronic devices, and electronic device manufacturing methods described.

We claim:

1. A method for fabricating an integrated circuit comprising the steps of:

forming an integrated circuit portion including a thin film of ferroelectric metal oxide material;

conducting process substeps causing hydrogenating or reducing conditions; and thereafter conducting a voltage-cycling recovery process by applying a number of voltage cycles to said ferroelectric metal oxide material, wherein said number of voltage cycles is $10^4$ cycles or greater.

2. A method according to claim 1, wherein said number of voltage cycles is in a range from approximately $10^4$ cycles to $10^{11}$ cycles, and said voltage cycles have a voltage amplitude in a range from 1 volts to 15 volts.

3. A method according to claim 1 wherein said number of voltage cycles is about $10^5$ and said voltage amplitude is selected from a range of voltages which are greater than 5 volts and less than or equal to 15 volts.

4. A method according to claim 1 wherein said number of voltage cycles is about $10^5$ and said voltage amplitude is about 10 volts.

5. A method according to claim 1 wherein said number of voltage cycles is about $10^9$ and said voltage amplitude is about 5 volts.

6. A method according to claim 1 wherein said step of conducting a voltage-cycling recovery process is done at a temperature from 30° C. to 200° C.

7. A method according to claim 6 wherein said step of conducting a voltage-cycling recovery process is done at a temperature from 125° C. to 175° C.

8. A method according to claim 1 wherein said ferroelectric metal oxide material comprises a ferroelectric perovskite material of the $ABO_3$-type.

9. A method according to claim 8 wherein said ferroelectric perovskite material comprises lead zirconium titanate ("PZT").

10. A method according to claim 8 wherein said ferroelectric perovskite material comprises lead lanthanum zirconium titanate ("PLZT").

11. A method according to claim 1 wherein said ferroelectric metal oxide material comprises ferroelectric layered superlattice material.

12. A method according to claim 11 wherein said ferroelectric layered superlattice material comprises strontium bismuth tantalate.

13. A method according to claim 11 wherein said ferroelectric layered superlattice material comprises strontium bismuth tantalum niobate.

14. A method according to claim 1 wherein said substeps causing hydrogenating or reducing conditions comprise performing a forming-gas anneal before conducting said voltage-cycling recovery process.

15. A method according to claim 14 wherein said forming-gas anneal is performed at a temperature range from 300° to 1000° C. for a time duration from one minute to two hours.

* * * * *